United States Patent [19]
Toro-Lira

[11] Patent Number: 5,982,190
[45] Date of Patent: Nov. 9, 1999

[54] METHOD TO DETERMINE PIXEL CONDITION ON FLAT PANEL DISPLAYS USING AN ELECTRON BEAM

[76] Inventor: Guillermo L. Toro-Lira, 1180 Reed Ave., Apt. 58, Sunnyvale, Calif. 94086

[21] Appl. No.: 09/018,559

[22] Filed: Feb. 4, 1998

[51] Int. Cl.[6] .................................................. G01R 31/305
[52] U.S. Cl. ............................................ 324/770; 324/501
[58] Field of Search ..................................... 324/501, 751, 324/770, 73.1; 250/304, 305, 397, 492.2; 257/48

[56] References Cited

U.S. PATENT DOCUMENTS

| | | | |
|---|---|---|---|
| 5,276,400 | 1/1994 | Denyer et al. | 324/501 X |
| 5,371,459 | 12/1994 | Brunner et al. | 324/770 |
| 5,432,461 | 7/1995 | Henley | 324/770 |
| 5,504,438 | 4/1996 | Henley | 324/770 |

*Primary Examiner*—Glenn W. Brown
*Attorney, Agent, or Firm*—Burns, Doane, Swecker and Mathis LLP

[57] ABSTRACT

Testing of flat panel displays (FPDS) during manufacture is effected using an E-beam testing system operating in conjunction with unique signal processing and analysis. The E-beam testing system stimulates secondary electron emission by the thin film transistors (TFTs) of the FPD which is proportionate to the voltage of the TFTs. The TFTs, which are simultaneously activated by predetermined activation signal waveforms, exhibit voltage response patterns which are indicative of their operational condition. The response signal patterns are correlated with one or more test signals each associated with a matched filter whose output is dependent on the degree of similarity between the voltage signal and a test signal. The E-beam system uses a CRT gun to direct a beam of electrons at the substrate, which is at least partially disposed in a vacuum chamber. The vacuum chamber is evacuated and provided with an electron detector to sense secondary electron emission due to impingement of the electron stream on the substrate. In an alternative embodiment, a plurality of CRT guns are used in conjunction with a common vacuum chamber. The plural CRTs may share a common electron detector, or may each be provided with an associated electrostatically isolated detector. The system is preferably used to detect flat panel displays (FPDs) during manufacture.

28 Claims, 13 Drawing Sheets

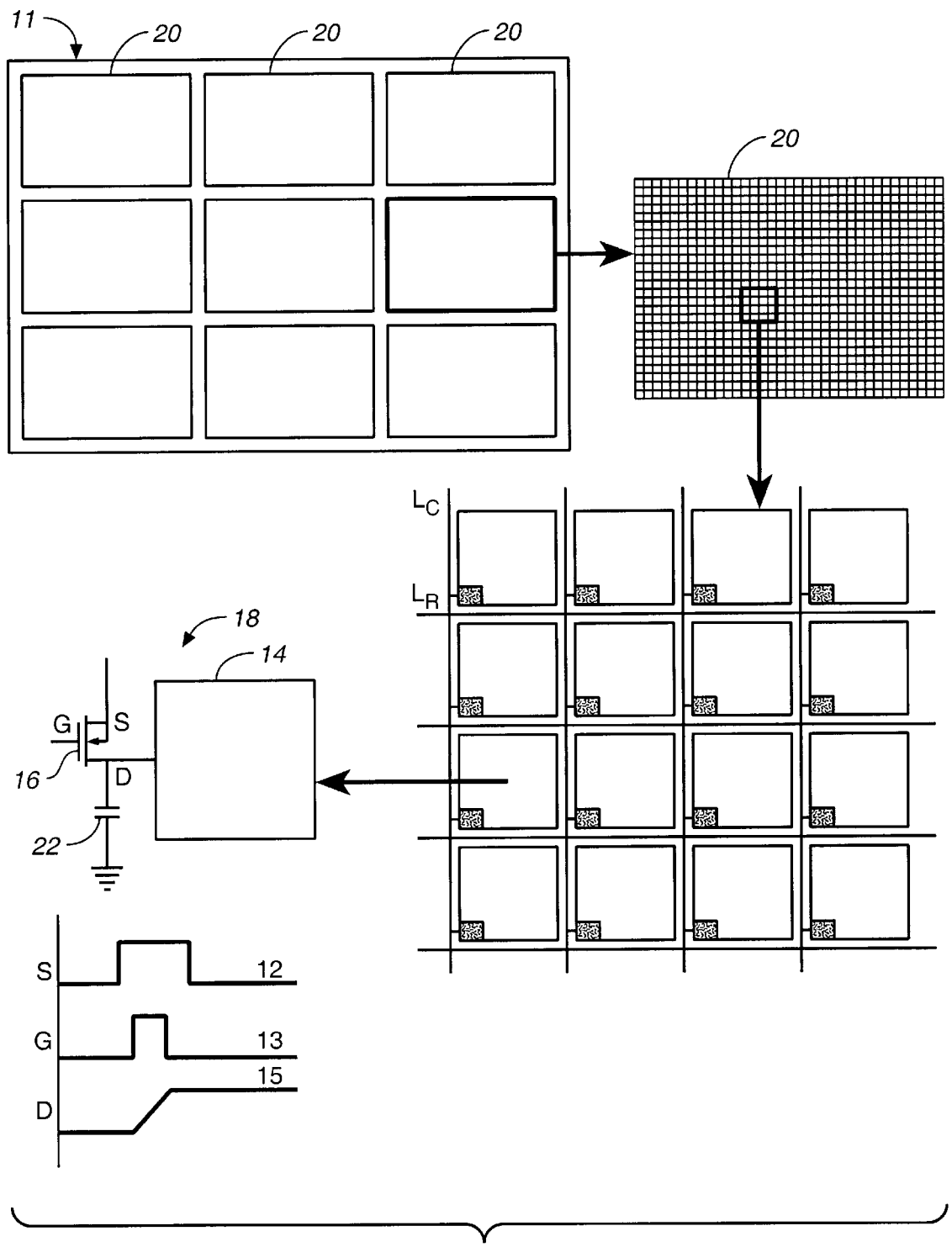
FIG._1
*(PRIOR ART)*

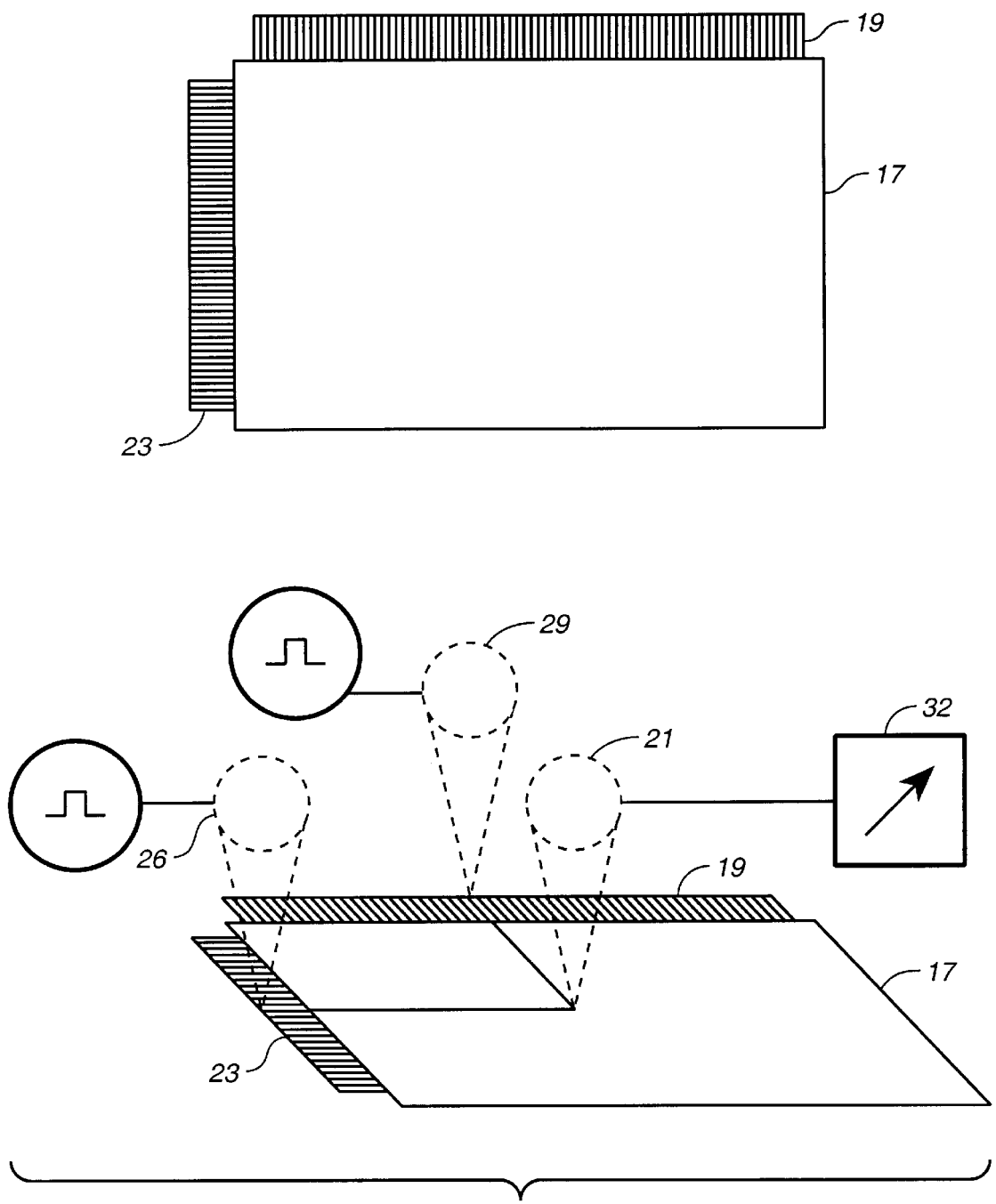
FIG._2
(PRIOR ART)

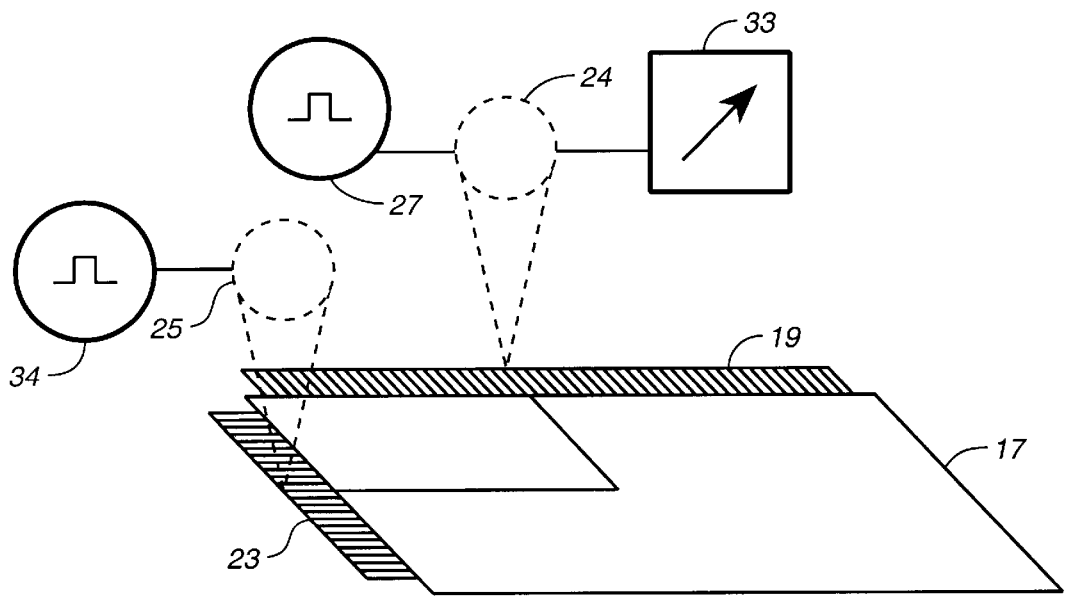
FIG._3
(PRIOR ART)
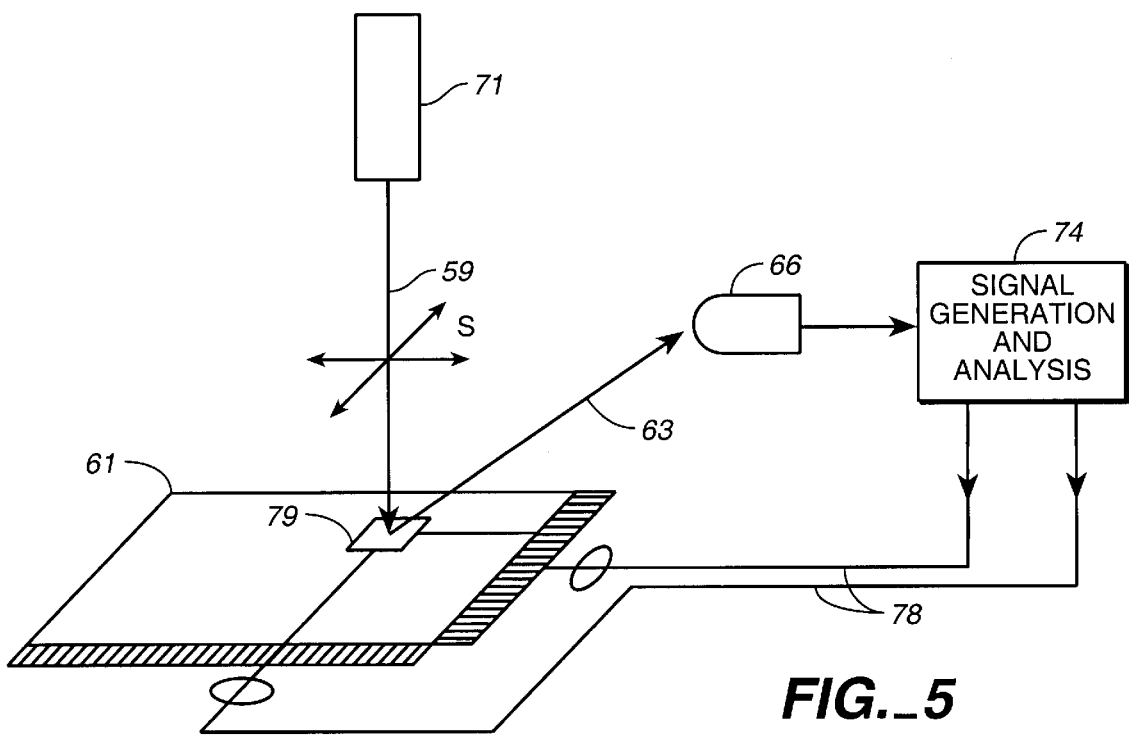
FIG._5

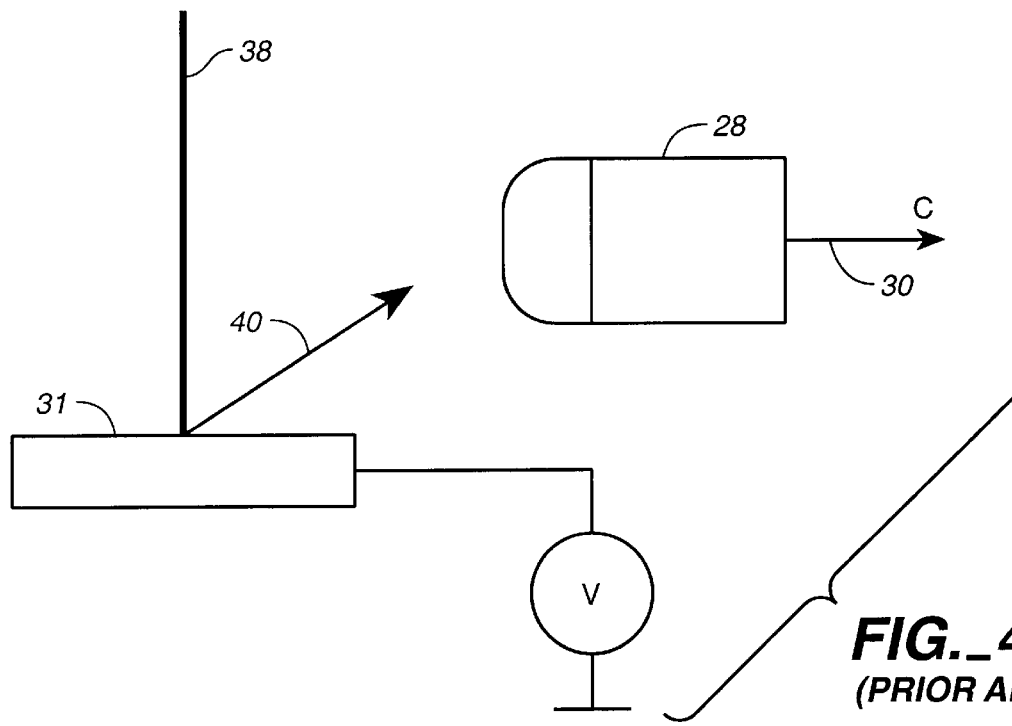
FIG._4A
(PRIOR ART)
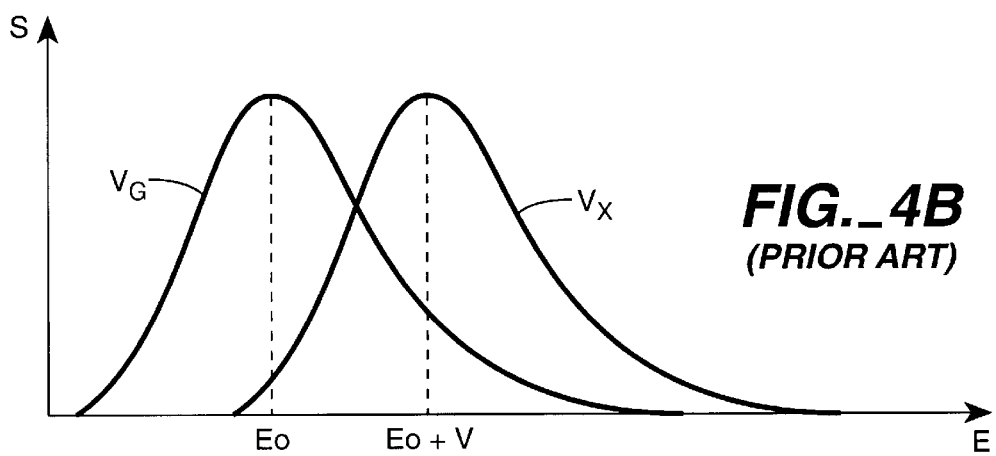
FIG._4B
(PRIOR ART)
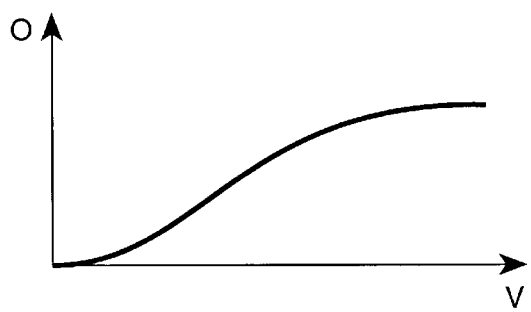
FIG._4C
(PRIOR ART)

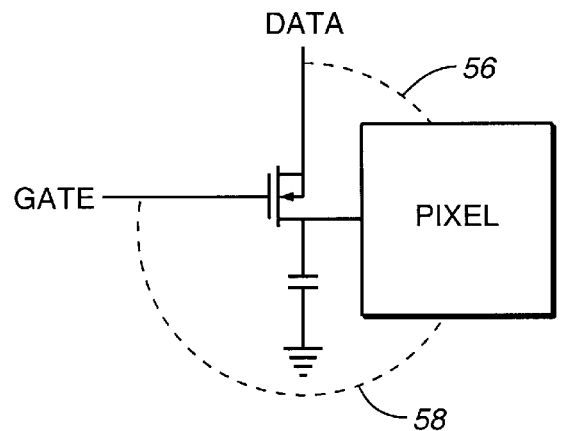
FIG._6A
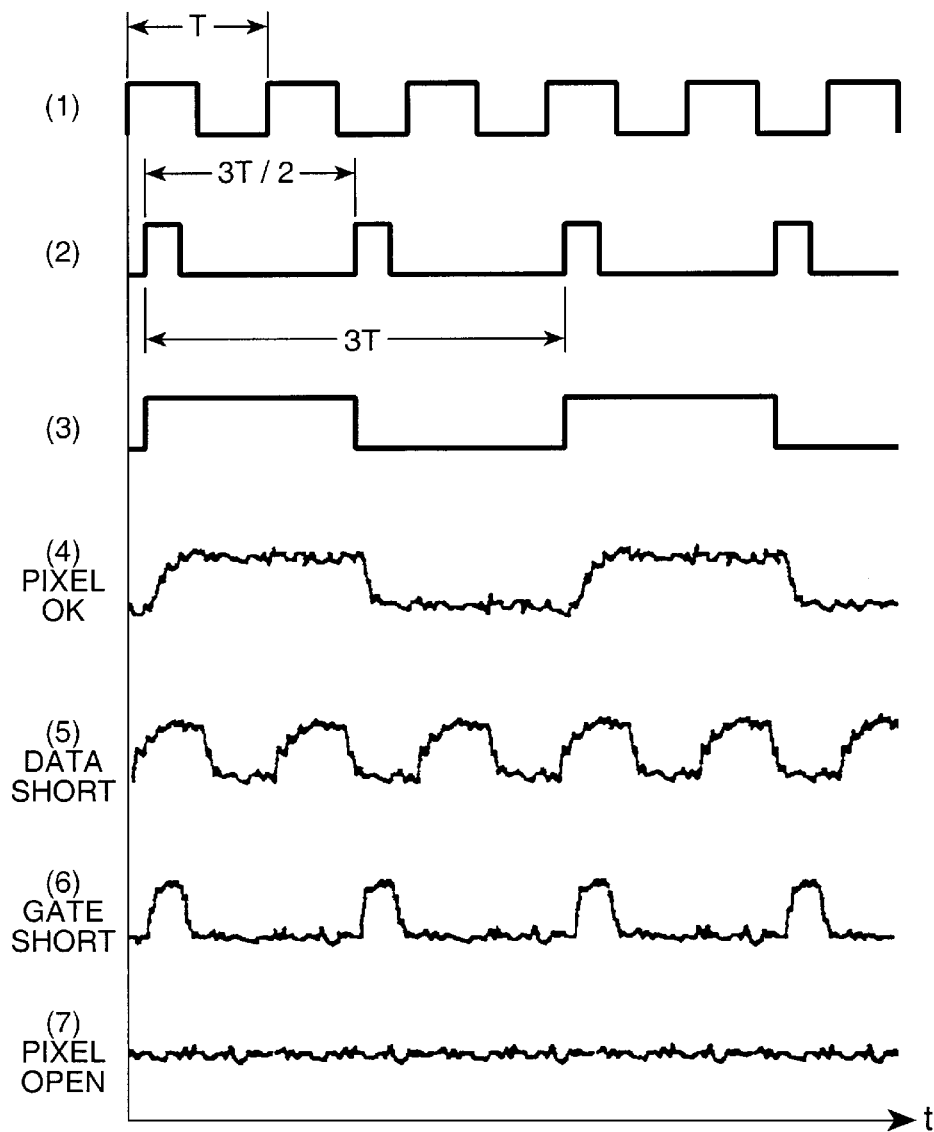
FIG._6B

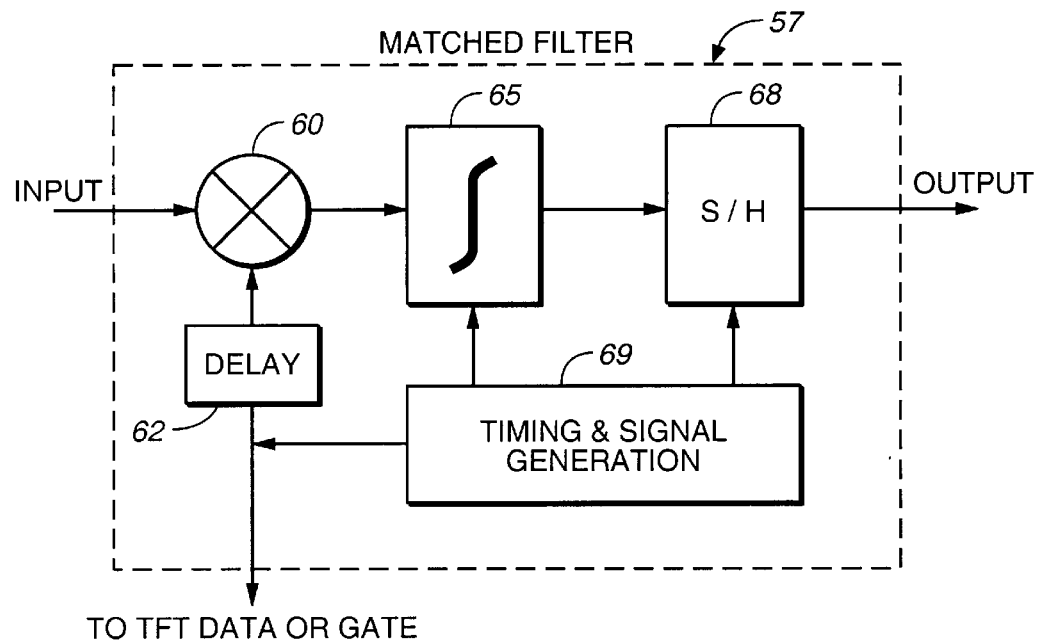
FIG._7
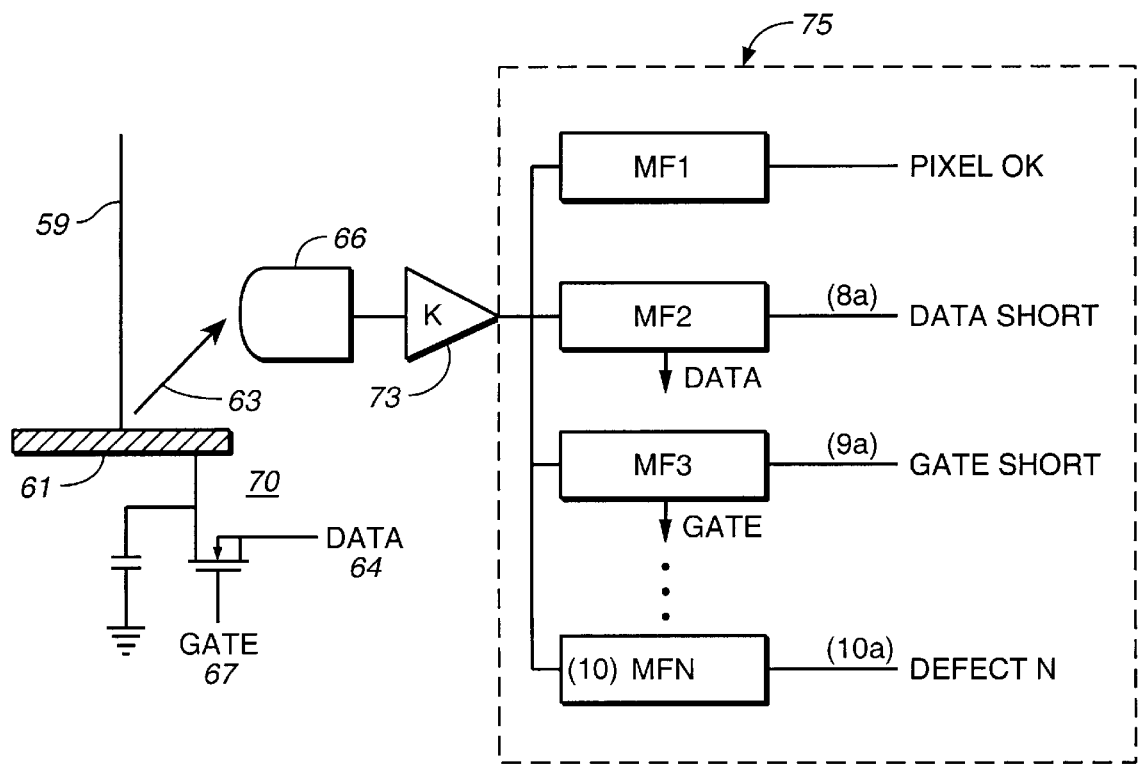
FIG._8

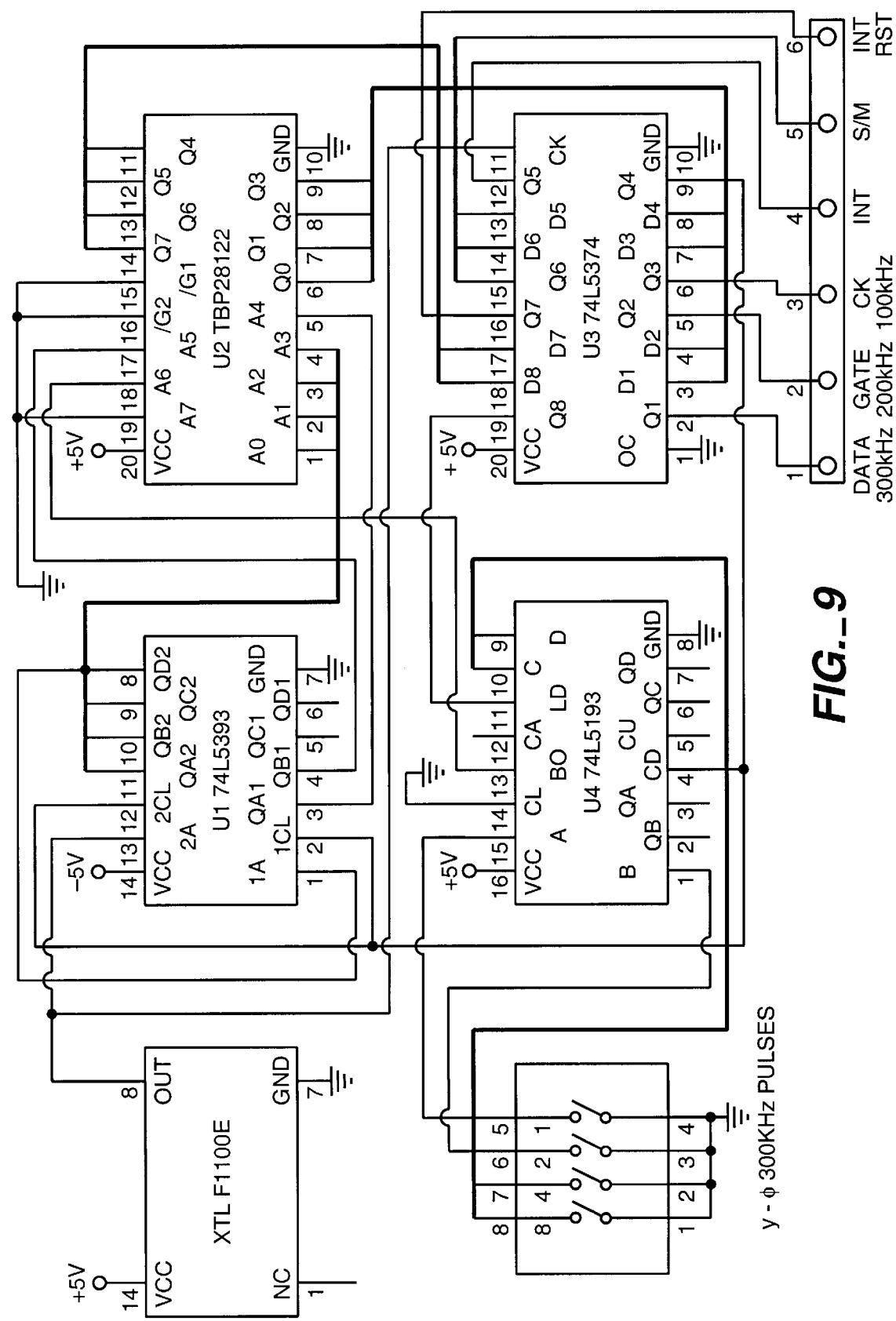
FIG._9

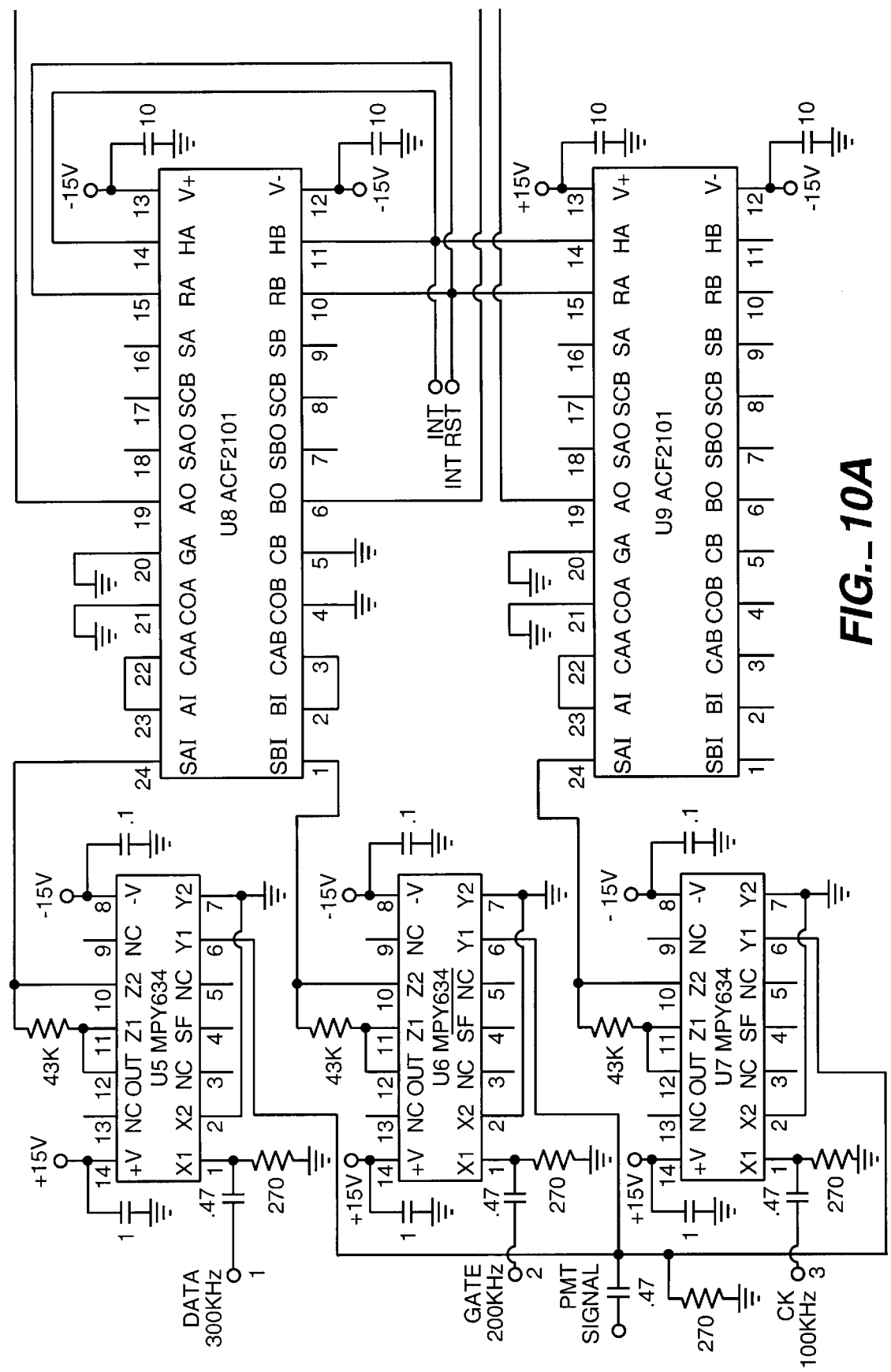
FIG._10A

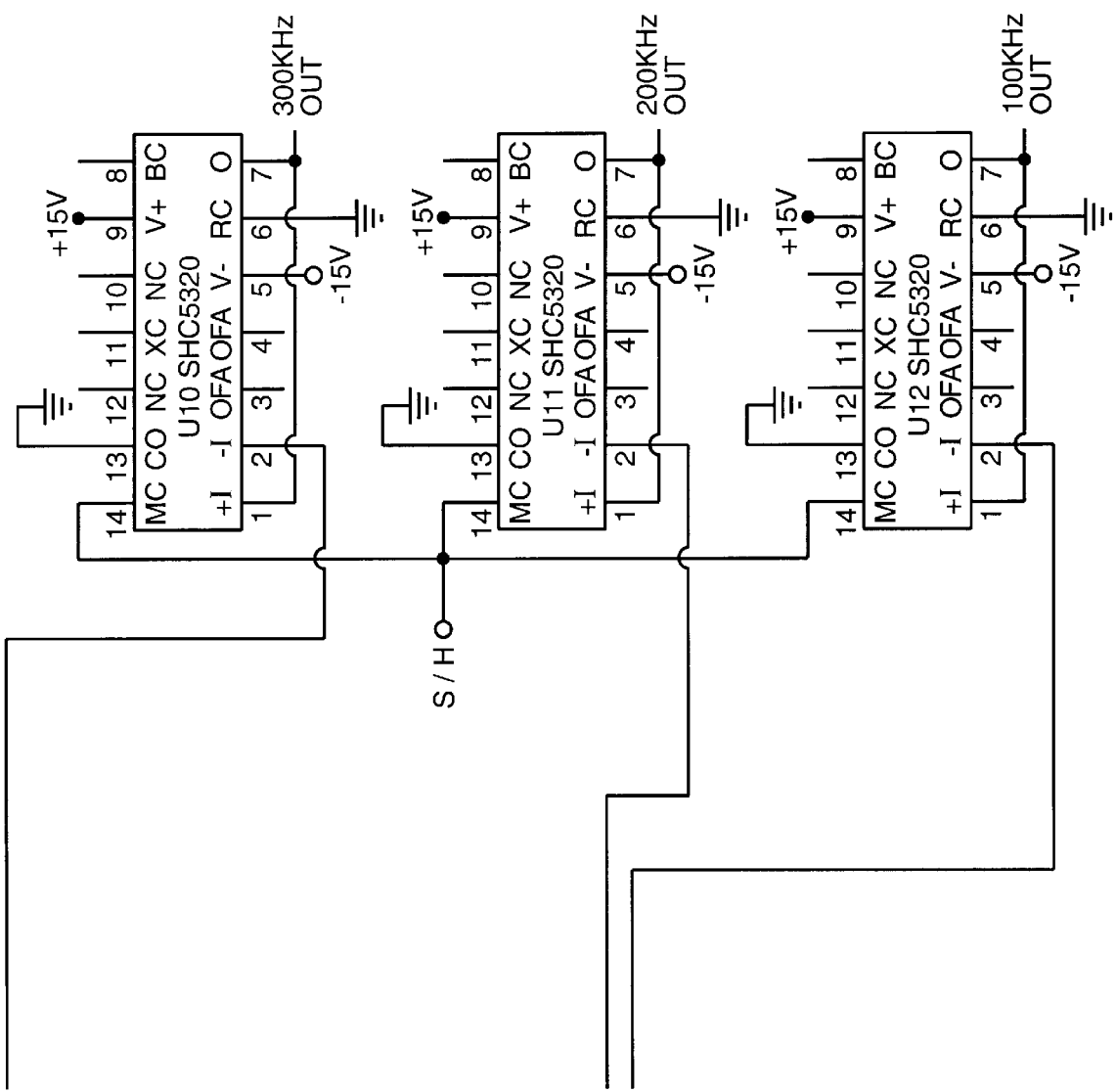
FIG._10
FIG._10A | FIG._10B
FIG._10B

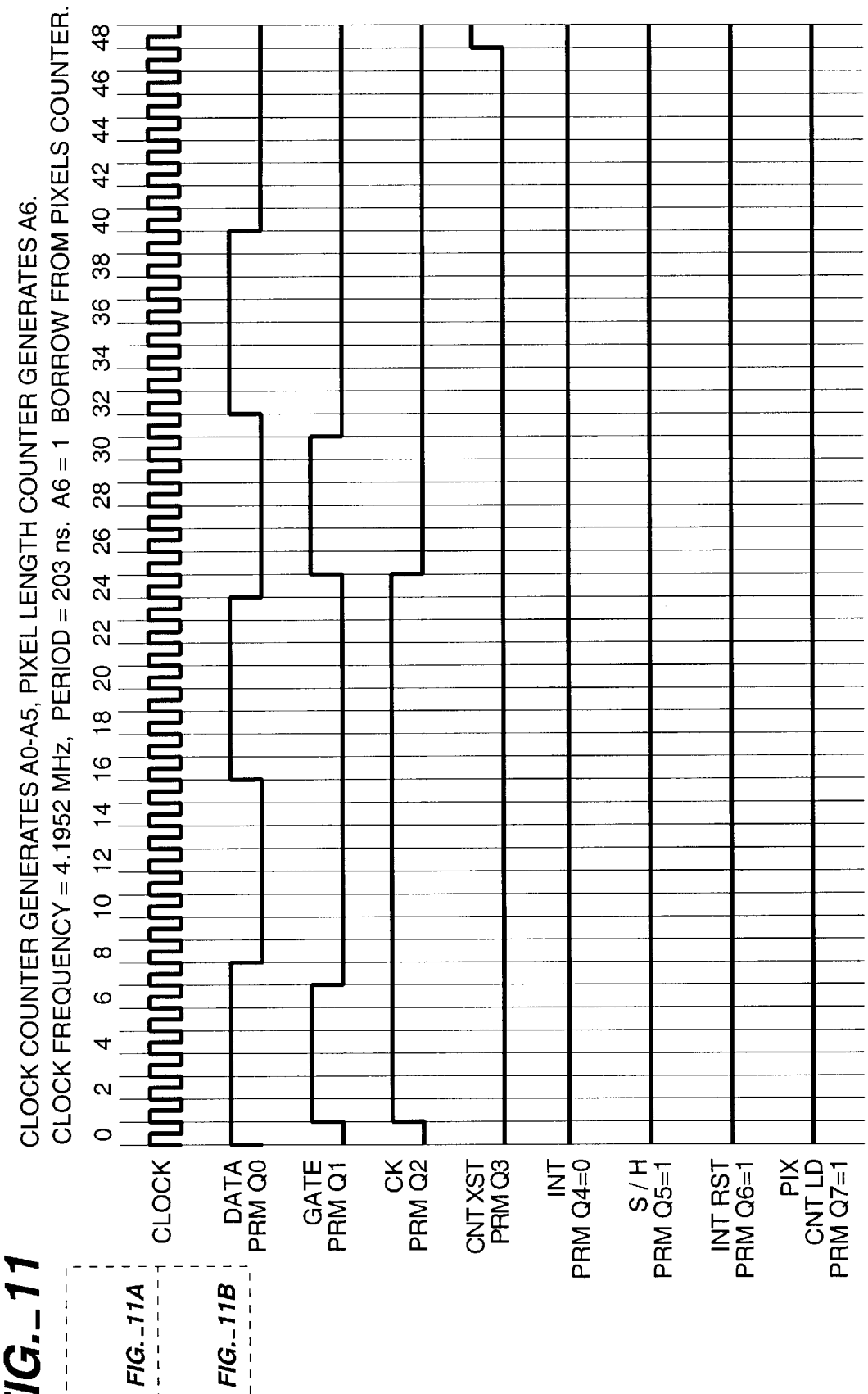
FIG._11A

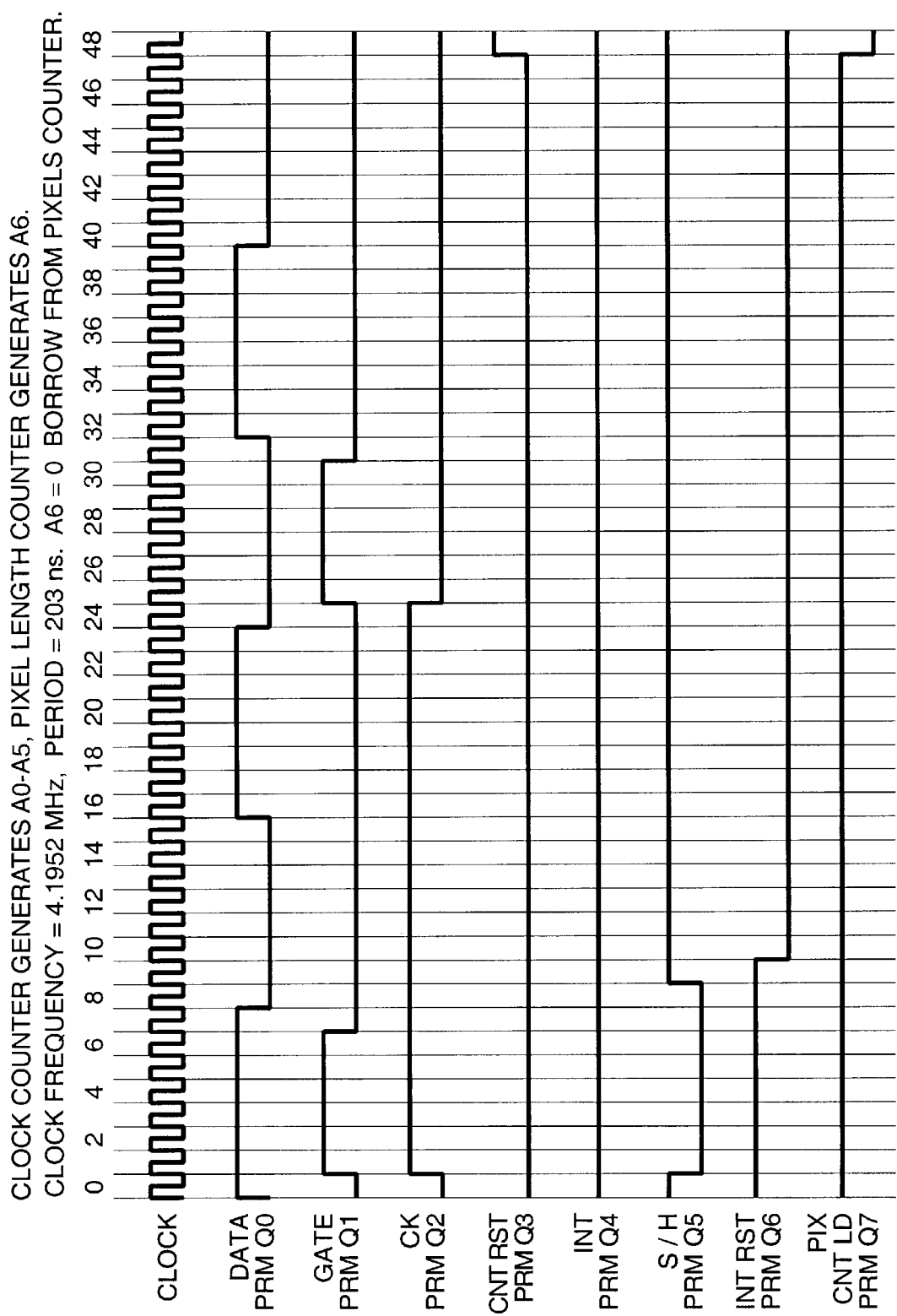
FIG._11B

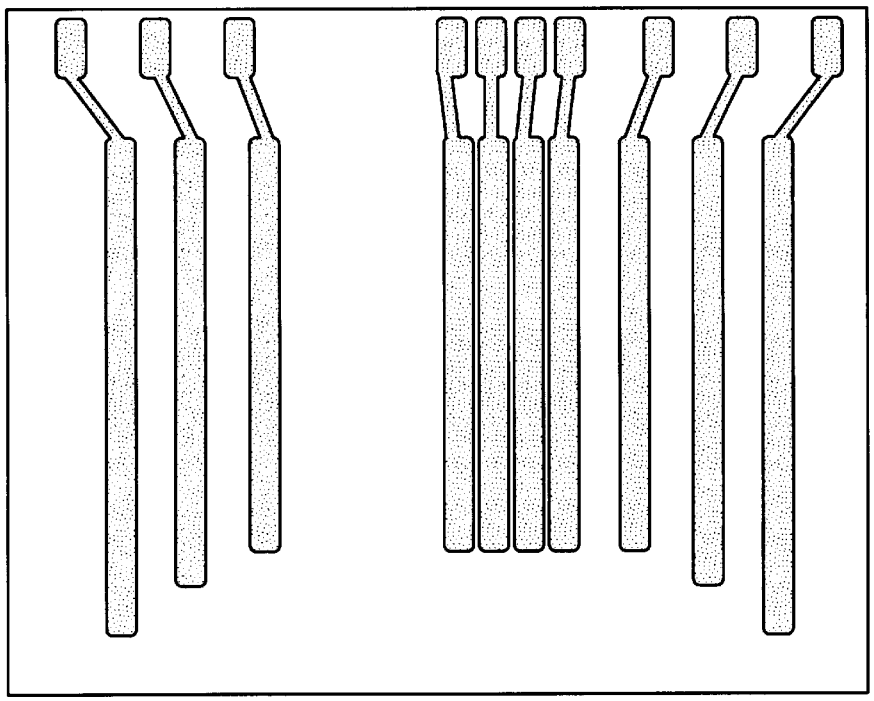
FIG._12
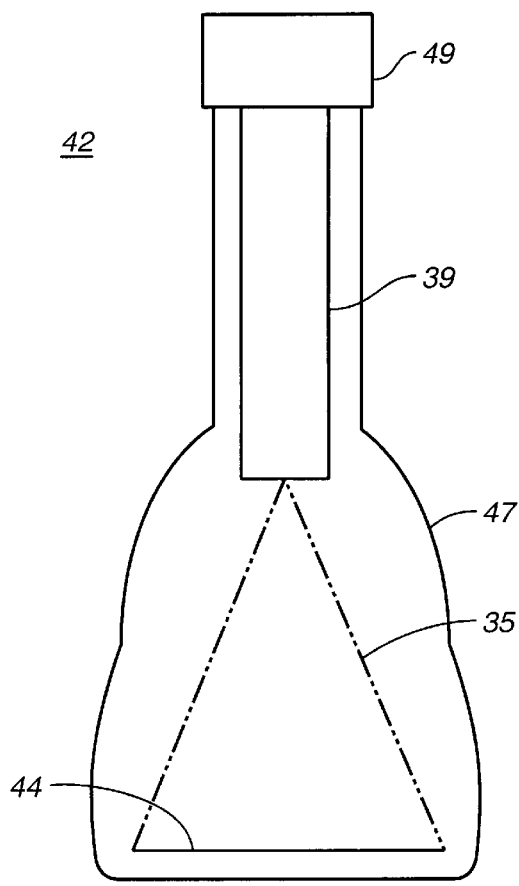
FIG._13
*(PRIOR ART)*

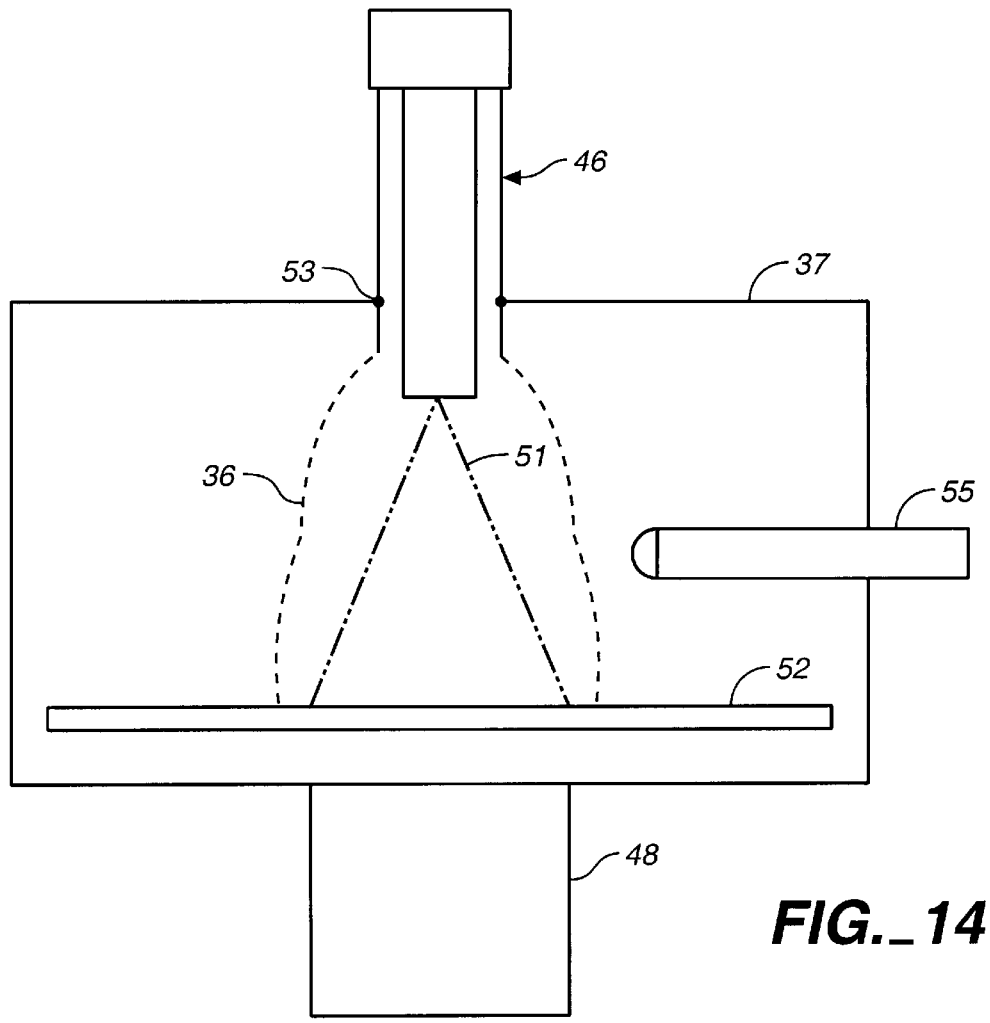
FIG._14
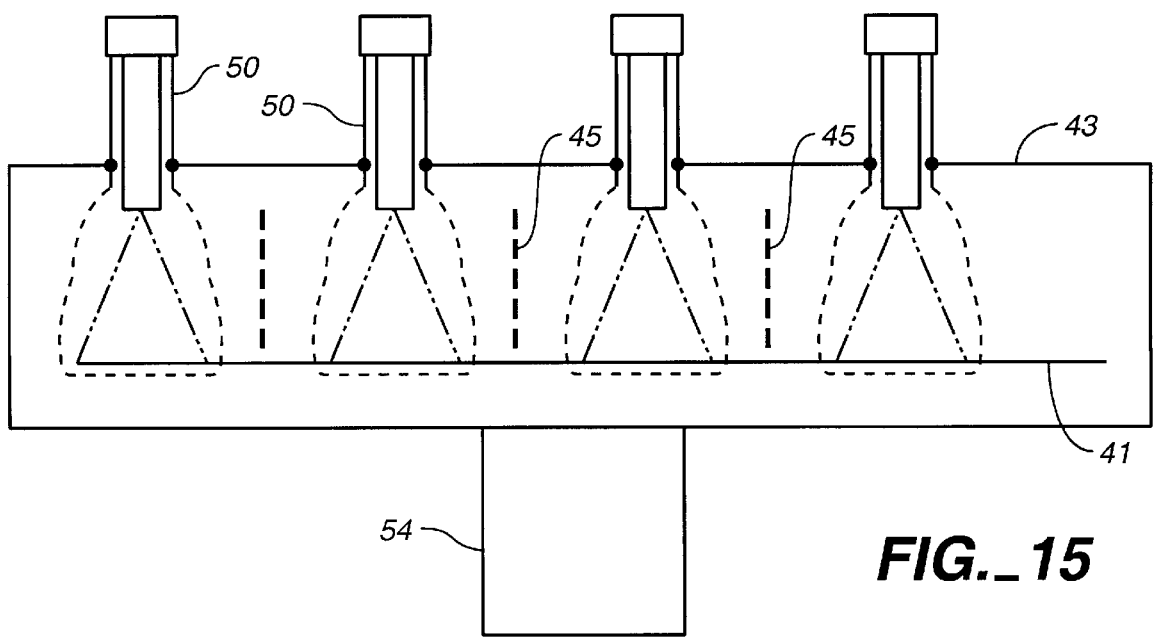
FIG._15

METHOD TO DETERMINE PIXEL CONDITION ON FLAT PANEL DISPLAYS USING AN ELECTRON BEAM

BACKGROUND OF THE INVENTION

1. Field of the Invention

This invention relates to testing systems, and more particularly, to electronic processing techniques for the high speed testing of substrates using voltage contrast methods.

2. Description of Related Art

Flat panel displays (FPDs) are viable alternatives to Cathode Ray Tubes (CRTs) for display of electronic information. They provide several advantages related to their small size and low power consumption. However, some manufacturing problems, such as the capability to test their expected performance during manufacturing, make them more expensive than typical CRTs. It is known that for replacing the CRT in consumer applications, such as TVs, the manufacturing costs of the FPDs must be lowered. Currently the most popular FPD technology is the Thin Film Transistor (TFT) Liquid Crystal Display (LCD). It is used in high end laptop computers, where the price sensitivity is not as significant as in general consumer electronics.

FIG. 1 schematically illustrates a typical TFT FPD layout. A multiplicity of TFT FPDs 20 are manufactured in a single glass substrate 11 using lithographic and semiconductor processes similar to those used in the manufacture of integrated circuits. A typical FPD 20 consists of an array of pixel electrodes that are individually and repetitively activated to control the liquid crystal light emission of the panel and thereby generate a two dimensional picture. The pixels are arranged in a column and row matrix layout. During display operation, each pixel is addressed by selecting the appropriate row $L_R$ and column $L_C$ signals. Each pixel 18 contains a pixel electrode 14, a TFT 16 and a storage capacitor 22. The TFT 16 is configured as an electronic switch. The TFT gate or switch control electrode G is connected to the display row selection signal $L_R$ and the TFT source electrode S to the display column signal $L_C$. At the time of individual pixel activation, the required voltage signal for the pixel is presented at the column line 12 and the TFT is switched on for a short time by activating the row signal 13. During that time, the storage capacitor 22 will charge to the voltage value presented on the TFT source line 15 and will maintain the voltage value until the next pixel refreshing cycle. By repeating this process to all the pixels in the display, a two dimensional image can be represented in the display.

Currently, the dominant technology for testing TFT FPD substrates during manufacture is based on direct electrical measurements provided by mechanical contact probes. FIG. 2 shows one such method. The column and row activation signals of the FPD are typically taken to two edges of the panel 17. In most cases, for electrostatic discharge protection reasons, the column 19 and row 23 lines are connected together with a resistive network which is later removed during the final steps of manufacture. In any case, a mechanical probe 21 is placed in contact with the particular pixel under test (PUT). The corresponding pixel row and column lines are also contacted with mechanical probes 26 and 29. These two probes generate the TFT pixel activation signals. The pixel signal is directly measured and its proper operation assessed using a multimeter type tester 32.

There are other types of mechanical contact probing techniques that do not use probe 21 but instead measure current signals generated in the row and column lines to give an indirect indication of the pixel condition. Such a system is shown in FIG. 3. In this case, the row or TFT gate signal line is contacted using probe 25 and a signal is injected using signal generator 34, while the TFT source signal line is contacted with probe 24 and a signal injected with generator 27 and currents read with multimeter type detector 33. This arrangement provides an indirect test of the condition of the PUT and does not need a mechanical contact probe directly into the PUT.

All mechanical contact probing methods have the major disadvantage that they require a large amount of mechanical contacts (one mechanical probe per row and column lines), signal generators and signal detectors. These mechanical probes are very expensive and must be completely replaced periodically. The probe replacement costs are around $100,000.

Optical test methods are also known. In this type of system all the rows and columns are activated simultaneously—by using the ESD shorting bars and the voltage values of the pixels are recorded using a piezostrictive optical modulator that is scanned in very close proximity to the panel. This method eliminates the need for a large number of probes, but is slow and not well suited for mass production.

A well known technique for non-contact voltage measurements is that of voltage contrast, or E-beam testing, of substrates. This principle can be briefly explained with the aid of FIGS. 4A, 4B and 4C. As shown in FIG. 4A, when an electron beam 38 impinges a conductive sample 31, secondary electrons 40 are emitted from the surface. These electrons are electrostatic and are directed to a secondary electron detector 28 which converts the electron count to an electrical signal 30. If the sample 31 is connected to ground potential, the secondary electrons have an energy distribution as shown by curve $V_G$ of FIG. 4B. If the sample is electrically biased to any voltage V as FIG. 4A depicts, the energy distribution curve of the secondary electrons is proportionally shifted by the same amount V as shown by curve $V_X$ of FIG. 4B. If the secondary electron detector response is a function of the energies of the received secondary electrons, then the shift in the energy distribution will also cause a variation in the signal output 30. By measuring such a variation, the voltage V present at the sample can be inferred and the state of the sample under inspection deduced. This technique can thus be used to measure the integrity of circuit connections, in, e.g., the transistors of a flat panel display. Typically, the transfer function of a detection system of this kind is non-linear as shown in FIG. 4C, where V is the voltage at the sample and O is the signal of the detector. With a special type of detector, such as an electron spectrometer, the transfer function can be linearized to allow for a direct measurement of the voltage at the sample.

Several Publications and patents have been issued in this relatively well known prior art. Reference is made, for example, to U.S. Pat. No. 3,961,190, directed to a "Voltage Contrast Detector for a Scanning Electron Beam Instrument", by Lukianoff et al., 1976 and the paper "The Cylindrical Secondary Electron Detector as a Voltage Measuring Device in the Scanning Electron Microscope" by Ballantyne et al., Scanning Electron Microscopy/1972 (Part I).

SUMMARY OF THE INVENTION

The invention implements a testing scheme for flat panel displays (FPDs) which involves use of voltage contrast, or E-beam testing, in conjunction with unique electronic analysis techniques. In accordance with a first embodiment, a beam of electrons is directed towards the FPD while a pattern of activation signals is applied to the different portions of the thin film transistors (TFTS) comprising the pixels of the FPD. The beam of electrons, upon impinging the substrate, stimulates electron emissions which are subsequently detected. The detected signals are correlated with test signals using matched filters whose outputs are proportional to the similarity of the detected signals and the test signals. Each matched filter and associated test signal corresponds to a particular pixel condition, and the matched filter with the highest correlation output signal can be used as the determinant of the condition of the pixel. Relying on the principle that different conditions yield different output signatures, the matched filters can be tuned to identify non-defective pixels as well as various defects, such as data and gate shorts and open circuit conditions.

In accordance with a second embodiment of the invention, the analysis techniques are used with a modified Cathode Ray Tube (CRT) display which provides large electron beam scan areas for effecting voltage contrast, or E-beam testing of large area FPDs. An FPD under inspection is disposed in a high vacuum chamber into which an electron beam from the tube part of a CRT, referred to hereinafter as the CRT gun, is directed. The generated electron beam is scanned across the FPD substrate in the chamber and the test signal pattern applied. The electrons emanating from the substrate are detected by an electron detector to thereby effect voltage contrast, or E-beam testing of the FPD. Defects can thus be detected and their nature determined.

In a third embodiment, the testing scheme is used with a plurality of CRT guns, with the CRT guns sharing a common vacuum chamber in which the FPD substrate is disposed for inspection. The CRT guns can each be provided with a corresponding electron detector, in which electrostatic shields may be used to separate detection regions. Alternatively, the CRT guns may all share a common electron detector. In such a multiple gun arrangement, CRT scanning areas may overlap, or, in an alternative aspect of the embodiment, gaps may be provided between scanning areas such that inspection of the FPD may need to be performed over the course of multiple scans.

BRIEF DESCRIPTION OF THE DRAWINGS

Many advantages of the present invention will be apparent to those skilled in the art with a reading of this specification in conjunction with the attached drawings, wherein like reference numerals are applied to like elements and wherein:

FIG. 1 is a schematic illustration of a conventional FPD during the manufacturing process;

FIG. 2 is a schematic illustration of a conventional FPD testing system using mechanical contact probes and based on direct electrical measurements;

FIG. 3 is a schematic illustration a second type of conventional FPD testing system using mechanical probes and based on current signals;

FIGS. 4A–4C are schematic illustrations showing the principle of conventional voltage contrast, or E-beam testing techniques;

FIG. 5 is a schematic view of a first embodiment for testing an FPD in accordance with the invention;

FIG. 6A is a diagrammatic illustration of gate and data short defects of a pixel;

FIG. 6B is a representation of the various input and output waveforms generated in accordance with the invention;

FIG. 7 is a diagram of a correlation circuit in the form of a matched filter in accordance with the invention;

FIG. 8 is a schematic illustration of an embodiment in accordance with the invention in which multiple matched filters are employed;

FIGS. 9–10 are circuit diagrams of an implementation in accordance with the invention;

FIG. 11 is a timing diagram of the circuits of FIGS. 9–10;

FIG. 12 is a representative image of a circuit under analysis using the techniques of the invention;

FIG. 13 is a schematic illustration of a conventional CRT device;

FIG. 14 is a schematic illustration of a testing device in accordance with the invention in which a CRT gun is used; and FIG. 15 is a schematic illustration of a testing device in accordance with an embodiment of the invention in which multiple CRT guns are used.

DESCRIPTION OF THE PREFERRED EMBODIMENTS

The invention involves E-beam testing of a flat panel display whose TFT pixel electrodes are activated with special activation signals. Depending on the operational condition of the pixel, this activation will give rise to variations in pixel voltage, as detected by the E-beam method, which are characteristic of the condition of the pixel and which serve to identify the type of defect, if any, present in the pixel.

As shown in FIG. 5, an arrangement in accordance with the invention comprises an electron source 71 which emits a stream of electrons 59 directed at FPD 61. The impinging electrons give rise to electron emissions 63 which are detected by electron detector 66. The electron emissions are proportional to the voltage of the emitting substrate, which in the analysis of the invention is the TFT transistor (not shown) of each pixel 79.

The output of electron detector 66, representative of the voltage of the pixel under test, is provided to circuit 74 for analysis. This analysis relies on the each pixel's response, as indicated by its E-beam detected voltage, to activation signals applied at the terminals of the TFT of each pixel. The activation signals are generated in signal analysis and generation circuit 74 and applied to the pixels via lines 78. During the course of the testing procedure, the pixels 79 of the FPD 61 are electronically scanned by the activation signals from circuit 74 in synchrony with the scanning of electron beam 59 across the FPD surface, indicated by arrows S.

FIG. 6A shows a representative circuit schematic of one TFT pixel. The dashed lines 56 and 58 simulate short circuit defects to the Data and to the Gate lines respectively. This type of short circuit occurs during the manufacture of TFT FPDs and is used here as a representative example of shorting defects for the purpose of this invention.

As shown in FIG. 6B, during analysis in accordance with the invention, signal (1) is the signal that is applied to the Data line and signal (2) is the signal applied to the Gate line. If the pixel is in proper operational condition, ideally an electrical signal (3) will be present in the pixel electrode. Such a signal, when detected by the electron detector 66 of the invention, will of course exhibit some distortion due to a lower signal-to-noise ratio (SNR) and the inherent non-linear effect of voltage-to-detected signal transformation. Thus a typical output signal profile for the non-defective pixel is as shown in (4).

On the other hand, if the pixel electrode is defective due to a short to the Data or Gate lines, the detected signal will be as shown by waveforms (5) or (6) respectively. As a further example, if the pixel electrode is defective due to an open circuit between the TFT and the pixel electrode, the detected signal will be flat as shown in (7). Of course, there are many other types of defects that will change the shape of the detected signal and the exact shape will depend on the specifics for each TFT manufacturing technology. The present invention can be applied to any type of defect that generates a distinguishable signal and is not limited to the defects discussed herein by way of example only.

In the preferred embodiment of the invention, a matched filter is used to determine the degree of correlation between the activation signal as applied to the Data or Gate terminals of the TFT and the output signal of the electron detector 66. The output of such a matched filter would thus be maximal at the greatest degree of correlation and minimal for minimal correlation. It is to be understood, of course, that the matched filter (or filters, as discussed below) could be tuned to detect correlation between the signal from electron detector 66 and any desired test signal waveform to thereby generate an output proportional to the degree of correlation between the detected signal and the test signal.

FIG. 7 shows a schematic of a representative matched filter 57 used in the present invention. The detected Input signal from detector 66 is applied to a multiplier circuit 60, which operates to multiply the Input signal with a time-delayed version of the TFT Data or Gate activation signal as delayed by delay circuit 62 and thereby produce a product of the two signals. In this particular circuit, the TFT Data and Gate activation signals are used as the test signals with which the detector signal is correlated and the introduced delay is necessary in order to compensate for the delay that occurs during the detection of the electron signal. Where a different test signal is used as discussed above, the delay may not be necessary or may be effected in a different manner as dictated by the particular circuit constraints.

The output of multiplier 60 is applied to integrator 65. With this arrangement, the output of the integrator will rise in time in direct proportion to the similarity between the Input signal and the delayed activation signal. After a predetermined period of time, the output of the integrator 65 is sampled by the sample-and-hold (S/H) circuit 68 and then presented as the output of the matched filter. At the same time, the integrator is reset to zero and the process starts again.

The above events are all conducted in synchronism and are controlled by a timing and signal generation circuit 69. Circuit 69 also generates the Data and Gate activation signals (9) which are applied to the pixels being tested. Other test signals and waveforms can be generated and applied to the matched filters depending on the TFT being tested and the type of condition being analyzed. For instance, waveform (4) of FIG. 6B would require matching with a square wave having a period of 3T, while waveform (7) would be matched with a flat DC response.

One of the advantages of the present invention is its ability to detect a plurality of conditions at the same time, without the need for modifying the test method. This can be accomplished by providing several matched filters, each one "tuned" to a particular pixel condition. FIG. 8 shows a block diagram of this multiple filter principle. The electron beam 59 impinges a selected TFT under test 70 of FPD 61 and the electron emissions 63 are detected with detector 66 to thereby generate a detection signal which is applied to amplifier 73. At the same time the TFT electrode Data and Gate lines (64 and 67 respectively) are activated with the activation signals discussed above. The shape of the detected signal will depend on the overall electrical condition of the TFT circuit 70. The detected signal, after amplification by amplifier 73, is provided to a filtering module 75 comprising a multiplicity of matched filters. The filters MF1–MFn are each designed to correspond to a specific pixel condition. One filter (MF1) whose output is designated PIXEL OK is designed to maximize its output if the signal shape is the same as that resulting from the proper condition of the pixel. Filters MF2 and MF3 generate maximum outputs in the presence of the signals corresponding to the Data Short and Gate Short defective conditions respectively. Filters MF2 and MF3 also generate in synchronism the TFT activation signals applied at the lines Data and Gate lines, respectively, as discussed above. MFn is included in the drawing figure to indicate that generally any defect that generates a unique signal can be detected in accordance with the invention. Outputs of the matched filters MF1–MFn may be read into a computer (not shown) and software provided for comparing the values of all the signals. The greatest signal tells the condition of the pixel under test.

FIGS. 9 and 10 show an exemplary arrangement of electronic circuitry for implementing the invention, while FIG. 11 shows timing diagrams for this circuitry. One of ordinary skill in the art will recognize that other circuits or implementations may be used to practice the invention. For example, it is possible to implement the multiplicity of matched filters in software and thereby eliminate altogether the need for the circuitry shown.

FIG. 12 shows a representative image generated with the current invention. The signal image corresponds to the output of the PIXEL OK signal. The test sample shown has a succession of vertical rows that were activated with several types of signals corresponding to several defective conditions. The image shows in bright levels (white) all the areas where the PIXEL OK signal is present. Other areas have signals that do not have that shape corresponding to the PIXEL OK signal and are therefore darker and considered to be defective.

The invention can be used with any E-beam testing scheme where a stream of electrons is directed at a FPD substrate and the output electrons detected to provide an indication of pixel integrity. One such scheme contemplates the use of a CRT (cathode ray tube) gun to generate the necessary electron stream. To explain how this is achieved, first a typical CRT 42, as shown in FIG. 13, is described. The basic CRT display tube is a glass enclosure 47 under a high vacuum in the order of 10e-5 to 10e-8 Torr. A high energy electron beam 35 is electronically scanned and impinges an internal light emitting phosphorous coating 44. The electron beam is controlled with electrostatic and/or electromagnetic lenses and deflection devices 39. The electron beam is typically of the thermo-ionic emission type and is generated in region 49. For purposes of this discussion, the conventional device 42 will be referred to as a CRT display, whereas the components exclusive of the glass enclosure 47 and the phosphorous coating 44 will be referred to as the CRT gun.

As shown in the arrangement of FIG. 14 in accordance with the invention, the CRT display is essentially cut open and installed into a high vacuum chamber containing the FPD under test (52). The CRT gun 46 is coupled with high vacuum chamber 37 using a vacuum seal 53, the vacuum chamber 37 effectively replacing the glass enclosure 36 of the conventional CRT display. The chamber 37 is brought to the CRT gun operational pressure using a high vacuum pump arrangement 48. The electron beam 51 generated by the CRT gun 46 is then scanned across the FPD under test (52) in a work region and the electrons emanating from the sample are detected using an electron detector 55. The electron detector can be of the Everhart-Thornley type for the collection of secondary electrons which are the ones that carry the voltage contrast information. Signals from the detector, in conjunction with the appropriate signal pattern applied to the pixels of the FPD as discussed above, provide the necessary information to effect testing of the FPD display and identification of any defects present.

In some cases, it may be desirable to increase the effective scan area by using a set of multiple modified CRT displays, each associated with a corresponding work sub-region. This arrangement, illustrated in FIG. 15, is feasible due to the inexpensive cost of CRTs as compared to the sophisticated electron beam guns used in current electron beam testers and Scanning Electron Microscopes (SEMs) to which this invention may also be applied. Also, the CRTs' geometry allows for close geometrical integration in a multiple electron beam arrangement. As shown in FIG. 15, a plurality of CRT guns 50 are arranged in line. These guns share a common vacuum chamber 43 which is evacuated by pump 54. Although not shown for purposes of clarity, the arrangement may have only one secondary electron detector for all the CRT guns 50, or alternatively, one detector per CRT gun. The decision is based on the required speed of operation—in which the multiple detector arrangement provides much faster inspection operation due to the parallel processing architecture. FIG. 15 shows 4 CRT guns, but there can be as many as required to cover any specific FPD area. Also, the CRT guns 50 can be positioned with a space between them, as shown in the drawing figure, or they can be disposed adjacent to each other with overlapping scan areas. The selection of the spacing will depend on the cost performance ratio required and on the configuration of the specific secondary electron detectors, which are also omitted from the drawings for purposes of clarity. In the case of the spacing arrangement shown in the drawing, total substrate coverage could be achieved by incrementally scanning the FPD 41 twice under the set of CRT guns 50 each with a horizontal offset equal to half the distance between guns. Of course, other scanning schemes fall within the purview of the invention.

In the case of having one electron detector per CRT gun, care must be taken to prevent the secondary electrons generated from the guns 50 from interacting into more than one detector. Depending on the distance of each detector to each gun scan area, the guns may be electrostatically shielded in the regions shown with dashed lines 45 in FIG. 15. The purpose of the electrostatic shielding is to allow only the electrons emanating from each gun to be collected by its corresponding electron detector.

The above are exemplary modes of carrying out the invention and are not intended to be limiting. It will be apparent to those skilled in the art that modifications thereto can be made without departure from the spirit and scope of the invention as set forth in the following claims.

What is claimed is:

1. A method of testing a flat panel display having an array of selectively addressable pixels, the method comprising the steps of:

a) electronically selecting from the array a pixel as the pixel under test by activating the pixel with one or more activation signals;

b) directing at least one beam of electrons at the pixel under test to thereby cause electron emission;

c) detecting the electron emission;

d) generating at least one output signal representative of said electron emission; and e) providing the output signal to one or more matched filters each having a correlation output which is a function of the similarity of the output signal to a test signal associated with the matched filter, the similarity indicating the condition of the pixel under test.

2. The method of claim 1, wherein at least one test signal comprises a time-delayed activation signal.

3. The method of claim 1, wherein the output signal is provided to an array of matched filters each having a unique test signal associated therewith and each adapted to generate a correlation output, the condition of the pixel being determined based on the greatest correlation output from the array of matched filters.

4. The method of claim 3, wherein the condition includes the nature of any defect present in the pixel.

5. The method of claim 1, wherein the step of selecting comprises applying the one or more activation signals to a thin film transistor (TFT) of the pixel under test.

6. The method of claim 1, wherein the step of electronically selecting comprises applying first and second activation signals respectively to data and gate terminals of a thin film transistor (TFT) of the pixel under test.

7. The method of claim 1, wherein the step of providing the output signal to one or more matched filters comprises:

integrating the product of the output signal and the test signal associated with the matched filter; and sampling the integrated product to thereby produce the correlation output.

8. The method of claim 7, wherein the steps of integrating and sampling are controlled by a timing and signal generation circuit.

9. The method of claim 8, wherein the timing and signal generation circuit is adapted to provide the activation signal.

10. The method of claim 1, further comprising the steps of:

enclosing a work region in vacuum conditions; and disposing the pixel under test in the work region, wherein the step of directing comprises directing at least one beam of electrons from a CRT gun at the pixel under test in the work region.

11. The method of claim 10, wherein the step of directing comprises using a plurality of CRT guns each providing an associated electron beam in an associated sub-region of the work region.

12. The method of claim 11, wherein each sub-region is provided with an associated electron detector.

13. The method of claim 1, wherein steps a–e are effected for each pixel in the flat panel display.

14. A device for determining the condition of a pixel of a flat panel display comprising:

an electron source adapted to stimulate secondary electron emission by the pixel;

an electron detector for detecting the secondary electron emission to thereby provide an output signal indicative of the voltage of the pixel;

an activation signal source for providing at least one activation signal to the pixel;

correlation means for receiving the output signal from the electron detector; and means for providing a test signal to the correlation means, wherein the correlation means is adapted to generate a correlation output which is proportional to the correlation between the voltage of the pixel and the test signal, the correlation output being representative of the condition of the pixel.

15. The device of claim 14, wherein the test signal is a time-delayed version of the activation signal.

16. The device of claim 14, wherein the pixel comprises a thin film transistor (TFT) having data and gate terminals, the activation signal source applying activation signals to the data and gate terminals.

17. The device of claim 14, wherein the correlation means comprises a plurality of matched filters each associated with a unique test signal and each adapted to generate a correlation output indicative of the correlation between the pixel voltage and the unique test signal associated with the matched filter.

18. The device of claim 17, wherein the pixel comprises a thin film transistor (TFT) and wherein said plurality of matched filters comprises at least four matched filters respectively associated with first, second, third and fourth test signals, the first test signal being characteristic of a non-defective pixel, the second test signal being characteristic of a TFT data short defect, the third test signal being characteristic of a TFT gate short defect, and the fourth test signal being characteristic of a open circuit defect, and wherein the determination of the condition of the pixel is based on which matched filter of the plurality of matched filters generates the highest correlation output.

19. The device of claim 14, wherein the correlation means comprises a matched filter having an output which is proportional to the similarity between the output signal and the test signal.

20. The device of claim 19, wherein the matched filter comprises:
   a multiplier for receiving the output signal and the test signal and for generating a product signal comprising the product of the output signal and the test signal;
   an integrator for integrating the product signal to thereby generate an integration signal;
   a sample-and-hold circuit for sampling the integration signal and generating the correlation signal therefrom.

21. The method of claim 20, wherein the matched filter further comprises:
   a timing and signal generation circuit for controlling the multiplier and integrator and for providing the activation signal to the pixel; and
   a delay means for delaying the activation signal and providing the delayed activation signal to the multiplier as the test signal.

22. A method of testing a flat panel display (FPD) having an array of thin film transistors (TFTs) by using voltage contrast, the method comprising:

individually selecting a TFT of the array as the TFT under test;

applying one or more activation signals to the TFT under test;

measuring electron emission from the TFT under test to thereby generate a voltage signal indicative of the voltage of the TFT under test; generating a plurality of correlation signals each being in proportion to the degree of similarity between the voltage signal and a unique test signal; and characterizing the condition of the TFT under test by selecting from the plurality of correlation signals the signal exhibiting the highest degree of similarity.

23. The method of claim 22, wherein at least four unique test signals are used, the first unique test signal corresponding to a non-defective TFT characterization, the second unique test signal corresponding to a TFT data short characterization, the third unique signal corresponding to a TFT gate short characterization, and the fourth unique test signal corresponding to an open circuit characterization.

24. The method of claim 23, wherein the TFTs of the array each comprises data and gate terminals, and wherein the second and third unique test signals respectively comprise first and second time delayed versions of activation signals respectively applied to the data and gate terminals of the TFT under test.

25. The method of claim 22, wherein the step of generating a plurality of correlation signals comprises, for each correlation signal:
   integrating a product of the voltage signal and the test signal; and
   sampling the integrated product.

26. The method of claim 22, further comprising the steps of:
   enclosing a work region in vacuum conditions;
   disposing the TFT under test in the work region; and
   directing at least one beam of electrons from a CRT gun at the TFT under test in the work region to thereby generate the electron emission.

27. The method of claim 26, wherein the step of directing comprises using a plurality of CRT guns each providing an associated electron beam in an associated sub-region of the work region.

28. The method of claim 27, wherein each sub-region is provided with an associated electron detector for measuring electron emission.

* * * * *